United States Patent
Lee et al.

(10) Patent No.: US 10,090,184 B2
(45) Date of Patent: Oct. 2, 2018

(54) CARRIER SUBSTRATE, METHOD OF MANUFACTURING THE SAME, AND METHOD OF MANUFACTURING FLEXIBLE DISPLAY DEVICE USING THE CARRIER SUBSTRATE

(71) Applicant: Samsung Display Co., Ltd., Yongin-si, Gyeonggi-do (KR)

(72) Inventors: Dong-Min Lee, Yongin-si (KR);
Young-Sik Yoon, Yongin-si (KR);
Mu-Gyeom Kim, Yongin-si (KR);
Mu-Jin Kim, Yongin-si (KR);
Jae-Hyun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 195 days.

(21) Appl. No.: 15/167,795

(22) Filed: May 27, 2016

(65) Prior Publication Data
US 2016/0276202 A1 Sep. 22, 2016

Related U.S. Application Data

(62) Division of application No. 13/802,385, filed on Mar. 13, 2013, now Pat. No. 9,355,877.

(30) Foreign Application Priority Data

Aug. 31, 2012 (KR) .......................... 10-2012-0096788

(51) Int. Cl.
*H01L 21/00* (2006.01)
*H01L 33/00* (2010.01)
(Continued)

(52) U.S. Cl.
CPC .......... *H01L 21/6835* (2013.01); *C03C 17/32* (2013.01); *H01L 21/673* (2013.01);
(Continued)

(58) Field of Classification Search
CPC ... H01L 21/00; H01L 21/673; H01L 21/6835; H01L 21/60; H01L 21/68; H01L 21/68;
(Continued)

(56) References Cited

U.S. PATENT DOCUMENTS

2002/0119633 A1* 8/2002 Yamazaki ......... H01L 29/66757
438/308
2010/0025831 A1* 2/2010 Yamazaki ........ G06K 19/07749
257/679
(Continued)

FOREIGN PATENT DOCUMENTS

KR 10-2005-0060733 A 6/2005
KR 10-2007-0103162 A 10/2007
KR 10-2009-0097053 A 9/2009

*Primary Examiner* — Jacob T Minskey
*Assistant Examiner* — Matthew Hoover
(74) *Attorney, Agent, or Firm* — Lewis Roca Rothgerber Christie LLP

(57) ABSTRACT

A carrier substrate includes: a base substrate; a first coating layer on a first surface of the base substrate; and a second coating layer on a second surface of the base substrate. The thermal expansion coefficients of the first coating layer and the second coating layer are greater than a thermal expansion coefficient of the base substrate, and a thickness of the first coating layer is different from a thickness of the second coating layer.

5 Claims, 4 Drawing Sheets

(51) Int. Cl.
*H01L 51/00* (2006.01)
*C03C 17/00* (2006.01)
*H01L 21/683* (2006.01)
*H01L 21/673* (2006.01)
*H01L 33/52* (2010.01)
*C03C 17/32* (2006.01)
*H01L 27/32* (2006.01)

(52) U.S. Cl.
CPC ............ H01L 33/52 (2013.01); H01L 51/003 (2013.01); *C03C 2217/20* (2013.01); *C03C 2218/116* (2013.01); *C03C 2218/365* (2013.01); *H01L 27/3244* (2013.01); *H01L 2221/6835* (2013.01); *H01L 2221/68377* (2013.01); *H01L 2221/68381* (2013.01); *H01L 2227/326* (2013.01); *H01L 2251/5338* (2013.01); *Y10T 428/24942* (2015.01); *Y10T 428/24975* (2015.01)

(58) Field of Classification Search
CPC ..... H01L 21/683; H01L 21/683; H01L 33/00; H01L 33/50; H01L 33/52; H01L 51/00; H01L 51/003; C03C 17/00; C03C 17/30; C03C 17/32
See application file for complete search history.

(56) References Cited

U.S. PATENT DOCUMENTS

2012/0171454 A1* 7/2012 Kondo .................... B32B 17/10
 428/220
2012/0227790 A1* 9/2012 Auman .............. C08G 73/1042
 136/249

* cited by examiner

CARRIER SUBSTRATE, METHOD OF MANUFACTURING THE SAME, AND METHOD OF MANUFACTURING FLEXIBLE DISPLAY DEVICE USING THE CARRIER SUBSTRATE

CROSS-REFERENCE TO RELATED PATENT APPLICATION

This application is a divisional of U.S. patent application Ser. No. 13/802,385, filed Mar. 13, 2013, which claims priority to and the benefit of Korean Patent Application No. 10-2012-0096788, filed Aug. 31, 2012, the entire content of both of which is incorporated herein by reference.

BACKGROUND

1. Field

Embodiments of the present invention relate to a carrier substrate, a method of manufacturing the carrier substrate, and a method of manufacturing a flexible display device using the carrier substrate.

2. Description of Related Art

Recently, display devices have been replaced with thin flat panel display devices that are portable and may be implemented to have large screen characteristics. Organic or inorganic light-emitting display devices used as flat panel display devices may be self-emissive display devices having wide viewing angles, high contrast ratios, and high response speeds, and thus, are regarded as next-generation display devices. Organic light-emitting display devices, including an emission layer formed of an organic material, may have improved (or excellent) luminosity, driving voltage, and response speed characteristics relative to inorganic light-emitting display devices, and may realize a color image. Organic light-emitting display devices may also be implemented to be flexible using a plastic substrate with good flexibility.

When the plastic substrate is highly flexible, the plastic substrate should be supported during a process of manufacturing a flat panel display device. Accordingly, the plastic substrate may be bound to a carrier substrate made of glass while the flat panel display device is manufactured. However, due to different thermal expansion coefficients between the glass carrier substrate and the plastic substrate, warpage may occur while the display device is formed on the plastic substrate through a high-temperature process. This may cause problems, such as pattern errors, fracture of the carrier substrate, and delamination of thin films.

SUMMARY

Aspects of embodiments of the present invention provide a carrier substrate able to suppress warpage in a process of manufacturing a flexible display device, a method of manufacturing the carrier substrate, and a method of manufacturing a flexible display device using the carrier substrate.

According to an aspect of the present invention, there is provided a carrier substrate including: a base substrate; a first coating layer on a first surface of the base substrate; and a second coating layer on a second surface of the base substrate. The thermal expansion coefficients of the first coating layer and the second coating layer are greater than a thermal expansion coefficient of the base substrate, and a thickness of the first coating layer is different from a thickness of the second coating layer.

The thickness of the first coating layer may be from about 6 μm to about 8 μm, and the thickness of the second coating layer may be from about 8 μm to about 12 μm.

The first coating layer and the second coating layer may include polyimide.

The base substrate may include glass.

According to an aspect of the present invention, there is provided a method of manufacturing a carrier substrate, the method including: forming a first coating layer on a first surface of a base substrate so as to cause a warpage of the base substrate; and forming a second coating layer on a second surface of the base substrate so as to compensate for the warpage of the base substrate. The first coating layer and the second coating layer include polyimide, and a thickness of the first coating layer is different from a thickness of the second coating layer The thickness of the second coating layer may be greater than the thickness of the first coating layer.

The thickness of the first coating layer may be from about 6 μm to about 8 μm, and the thickness of the second coating layer may be from about 8 μm to about 12 μm.

The first coating layer and the second coating layer may be formed using spin coating.

The base substrate may include glass.

According to an aspect of the present invention, there is provided a method of manufacturing a flexible display device, the method including: preparing a carrier substrate; forming a display unit on the carrier substrate; and encapsulating the display unit. The preparing of the carrier substrate includes: forming a first coating layer on a first surface of a base substrate so as to cause a warpage of the base substrate; and forming a second coating layer on a second surface of the base substrate so as to compensate for the warpage of the base substrate. A thickness of the second coating layer is greater than a thickness of the first coating layer, and the display unit is formed on the second coating layer.

The first coating layer and the second coating layer may include polyimide.

The thickness of the first coating layer may be from about 6 μm to about 8 μm, and the thickness of the second coating layer may be from about 8 μm to about 12 μm.

The base substrate may include glass, and thermal expansion coefficients of the first coating layer and the second coating layer may be greater than a thermal expansion coefficient of the base substrate.

The display unit may include an active layer, and the active layer may be formed by crystallizing amorphous silicon.

The method may further include separating the second coating layer having the display unit on an upper surface thereof from the base substrate.

The separating the second coating layer from the base substrate may include irradiating a laser beam having a wavelength of from about 250 nm to about 350 nm and an energy of from about 250 mJ/cm2 to about 350 mJ/cm2 onto an interface between the second coating layer and the base substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
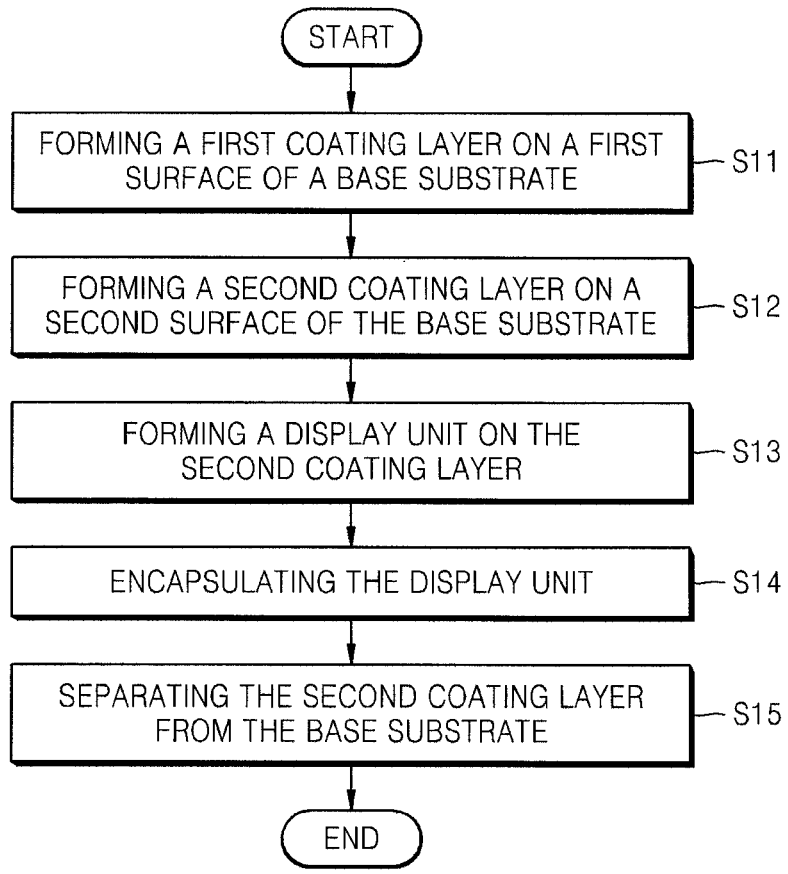
FIG. 1 is a flowchart of a method of manufacturing a flexible display device, according to an embodiment of the present invention.

As the invention allows for various changes and numerous embodiments, embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of embodiments of the present invention, certain detailed explanations of related art are omitted when it is deemed that they may unnecessarily obscure the essence of the invention.

Terms such as "first" and "second" are used herein merely to describe a variety of constituent elements, but the constituent elements are not limited by the terms. The terms are used only for the purpose of distinguishing one constituent element from another constituent element.

It will be understood that when an element, layer or region is referred to as being "on" another element, layer or region, the element, layer or region can be directly on another element, layer or region or there may be intervening elements, layers or regions therebetween.

Expressions such as "at least one of," when preceding a list of elements, modify the entire list of elements and do not modify the individual elements of the list.

Embodiments of the present invention will now be described more fully with reference to the accompanying drawings, in which exemplary embodiments of the invention are shown. In the drawings, the same elements are denoted by the same reference numerals, and a repeated explanation thereof will not be given. The thicknesses of layers and regions may be enlarged for clarity. In addition, the thicknesses of some layers and regions may be exaggerated for convenience of explanation.

Figure 2:
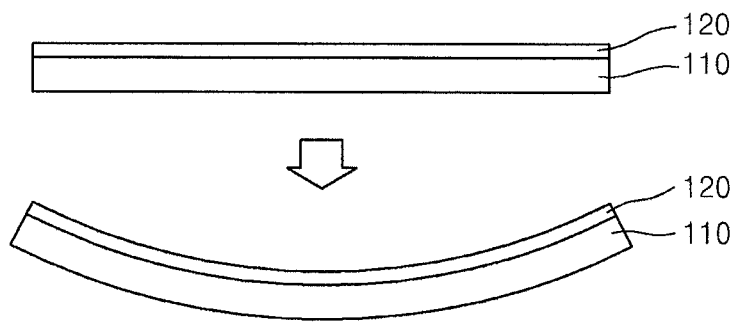
FIGS. 2 to 7 are schematic cross-sectional views illustrating the method of manufacturing a flexible display device of FIG. 1.
Figure 3:
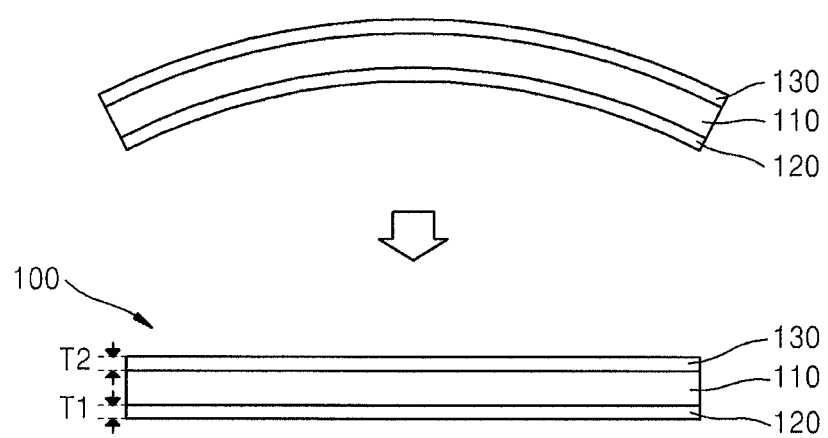

FIG. 1 is a flowchart of a method of manufacturing a flexible display device, according to an embodiment of the present invention. FIGS. 2 to 7 are cross-sectional views illustrating the method of manufacturing a flexible display device illustrated in FIG. 1. In particular, FIGS. 2 and 3 illustrate a method of manufacturing a carrier substrate, according to an embodiment of the present invention. FIGS. 4 to 7 illustrate a method of manufacturing a flexible display device using a carrier substrate manufactured according to an embodiment of the present invention.

Hereinafter, a method of manufacturing a carrier substrate, according to an embodiment of the present invention will be described with reference to FIGS. 1 to 3, and a method of manufacturing a flexible display device, according to an embodiment of the present invention, will be described with reference to FIGS. 4 to 7.

Referring to FIG. 1, a method of manufacturing a carrier substrate 100 (see FIG. 3), according to an embodiment of the present invention, includes forming a first coating layer 120 on a first surface of a base substrate 110 (Operation S11), and forming a second coating layer 130 on a second surface of the base substrate 110 (Operation S12).

The base substrate 110 may be formed of a transparent material so as to transmit a laser beam during a detachment process. The base substrate 110 may also be formed of a rigid material so as to support a display device that is formed on a surface thereof. For example, the base substrate 110 may be formed of glass including $SiO_2$ as a primary ingredient. Alternatively, the base substrate 110 may include at least one of borosilicate glass, fused silica glass, or quartz glass.

The first coating layer 120 may be formed of a plastic material, for example, polyimide with high thermal resistance that is durable against high temperatures at which low-temperature polysilicon (LTPS) is prepared (as described below). The first coating layer 120 may be formed on the first surface of the base substrate, for example, through spin coating and then heating.

A thermal expansion coefficient of the first coating layer 120 may be different from that of the base substrate 110. For example, the first coating layer 120 formed of a plastic material may have a larger thermal expansion coefficient as compared with that of the base substrate 110 formed of a glass material. Accordingly, once the first coating layer 120 is formed on the first surface of the substrate 110, due to a high compression stress of the first coating layer 120, the base substrate 110 and the first coating layer 120 may be bent in the direction away from the first surface of the base substrate 110 with the first coating layer 120 thereon, as shown in FIG. 2.

In this state, a second coating layer 130 may be formed on a second surface of the base substrate 110, as illustrated in FIG. 3.

Since used as a substrate for a flexible display device, the second coating layer 130 may be formed of polyimide having a high transmission ratio and high thermal durability. That is, the second coating layer 130 may be formed of the same material as used for the first coating layer 120. The second coating layer 130 may be formed on the second surface of the base substrate 110, for example, through spin coating and then thermal treatment, as in the forming of the first coating layer 120.

The second coating layer 130 may be formed to be thicker than the first coating layer 120. When formed of the same material, the second coating layer 130 and the first coating layer 120 may have the same or similar thermal expansion coefficient. However, when the second coating layer 120 has a larger thickness than the first coating layer 120, a compression stress of the second coating layer 130 may be larger than that of the first coating layer 120, thus compensating for a warpage cause by the first coating layer 120. That is, the warpage of the carrier substrate 100 caused due to the formation of the first coating layer 120 may be compensated for or relieved by the formation of the second coating layer 130.

The second coating layer 130 may be formed on a second surface of the base substrate 110 with the first coating layer 120 placed to contact a surface of a stage. A display unit, which will be described below, may be formed on the second coating layer 130. That is, a thin film transistor (TFT) array (see FIG. 5) and an organic light-emitting diode (OLED) may be formed on the second coating layer 130.

To prevent warpage during a deposition process and improve (or ensure) stability of the deposition process, the second coating layer 130 may be formed to have a thickness (T2) of about 8 μm to about 12 μm. When the thickness (T2) of the second coating layer 130 is less than 8 μm or larger than 12 μm, larger stress may be exerted on the second coating layer 130, and thus a thin film overlaying the second coating layer 130 may be more likely delaminated. When the thickness (T2) of the second coating layer 130 is less than 8

μm, the second coating layer 120 may not serve normally as a substrate of a flexible display device. When the thickness (T2) of the second coating layer 130 is larger than 12 μm, the flexible display device may be less flexible.

According to an aspect of the present invention, the compression stress of the second coating layer 130 and the compression stress of the first coating layer 120 are exerted in opposite directions, thus preventing warpage of the carrier substrate 100. When the thickness of the second coating layer 130 is the above-mentioned range of about 8 μm to about 12 μm, the first coating layer 120 may have a thickness (T1) of about 6 μm to about 8 μm for a balance of the opposite forces.

Warpage of the carrier substrate 100 during the manufacture of the carrier substrate 100 and further during manufacture of a flexible display device may be reduced so that the display unit 200 may be formed on the second coating layer 130 to be stable.

Although in the embodiment of FIGS. 2 and 3, the first coating layer 120 and the second coating layer 130 are formed to have the same or similar thermal expansion coefficient, and have different thicknesses, the present invention is not limited to this embodiment. For example, the first coating layer 120 and the second coating layer 130 may have the same or similar thicknesses. In this regard, to compensate for the compression stress of the first coating layer 120, which is formed prior to the formation of the second coating layer 130, the second coating layer 130 may have a larger thermal expansion coefficient than that of the first coating layer 120.

Hereinafter, a method of manufacturing a flexible display device using the carrier substrate 100, according to an embodiment of the present invention will be described.

Figure 4:
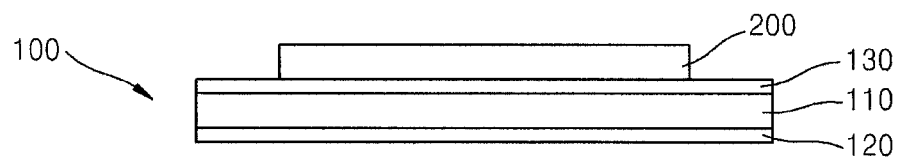

Referring to FIG. 4, in one embodiment a display unit 200 is formed on the second coating layer 130 of the carrier substrate 100 (Operation S13).

Figure 5:
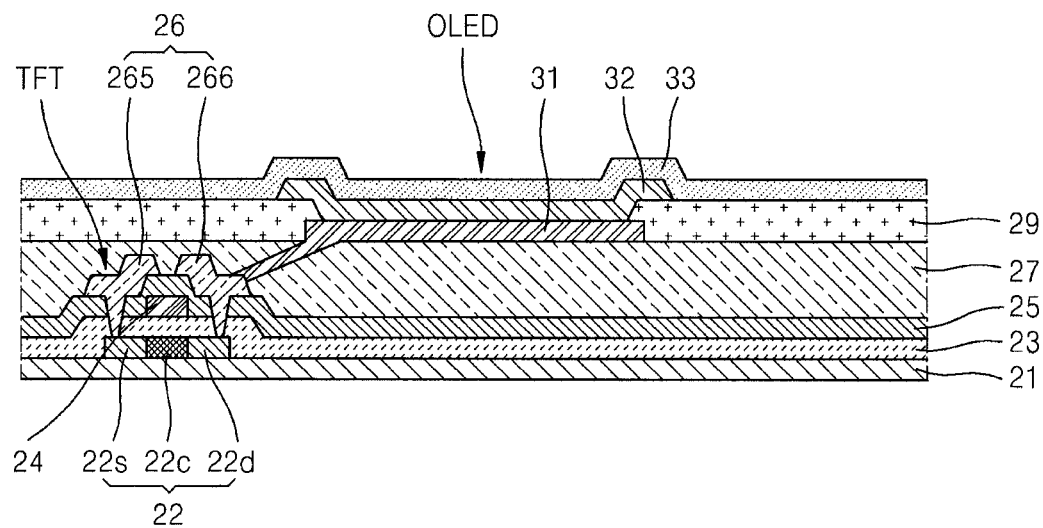

FIG. 5 is a cross-sectional view of a display unit 200 according to an embodiment of the present invention. Referring to FIG. 5, a TFT array and an OELD are formed on the second coating layer 130.

Prior to the formation of the TFT array, a buffer layer 21 may be formed on an upper surface of the second coating layer 130 for planarization and to block infiltration of impurities. The buffer layer 21 may be formed of $SiO_2$ and/or $SiN_x$ by any of a variety of deposition methods, for example, plasma enhanced chemical vapor deposition (PECVD), atmospheric pressure CVD (APCVD), or low-pressure CVD (LPCVD).

A TFT may be formed on the buffer layer 21. The TFT is electrically connected to an OLED and operates the OLED. Although, as an embodiment, FIG. 4 illustrates a top gate type TFT with an active layer, a gate electrode, and a source/drain electrode sequentially disposed upon one another, the present invention is not limited thereto. Any of a variety of TFT types may be used.

A semiconductor layer (not shown) may be formed on the entire surface of the buffer layer 21. The semiconductor layer may be formed of an inorganic semiconductor material, such as amorphous silicon, or an organic semiconductor material.

An amorphous silicon layer may be crystallized into polycrystalline silicon by any of a variety of methods. Examples of the crystallization methods are solid phase crystallization (SPC), excimer laser crystallization (ELC), metal induced crystallization (MIC), metal induced lateral crystallization (MILC), and sequential lateral solidification (SLS).

Subsequently, the resulting polycrystalline silicon layer may be patterned, and source and drain regions in edge regions of the patterned silicon layer may be doped with impurities and then activated to form an active layer 22 including a source region 22s, a drain region 22d, and a channel region 22c therebetween.

A process for forming the active layer 22 from the semiconductor layer may include a high-temperature process performed at about 300° C. to about 500° C. For example, with regard to Excimer Laser Annealing (ELA), the amount of hydrogen of amorphous silicon should be less than about 10%. This is because when the amount of hydrogen in the amorphous silicon layer is high, hydrogen may be generated upon irradiation of a laser beam for crystallization, the properties of polycrystalline silicon may deteriorate, and thus, a TFT having desirable (or excellent) properties may not be manufactured. Thus, a high-temperature process at about 300° C. to about 500° C. may be performed in order to reduce the amount of hydrogen in the amorphous silicon layer. In addition, in order to form the active layer 22 by doping polycrystalline silicon with impurities and activating the active layer 22, a high activation temperature of about 400° C. may be used.

A gate insulating layer 23 may be formed of $SiO_2$, $SiN_x$, or the like on the active layer 22, and a gate electrode 24 may be formed in a region (e.g., a predetermined region) of the gate insulating layer 23. The gate electrode 24 may be connected to a gate line (not shown) for applying an on/off signal of a TFT.

An interlayer insulating layer 25 may be formed on the gate electrode 24. A source electrode 265 and a drain electrode 266 (also shown as 26 in FIG. 5) may be formed to respectively contact the source region 22s and the drain region 22d of the active layer 22 via a contact hole. The resulting TFT may be covered and protected by a passivation layer 27.

The passivation layer 27 may be formed as an inorganic insulating layer and/or an organic insulating layer. The inorganic insulating layer may include $SiO_2$, $SiN_x$, SiON, $Al_2O_3$, $TiO_2$, $Ta_2O_5$, $HfO_2$, $ZrO_2$, BST, or PZT, and the organic insulating layer may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof. The passivation layer 27 may be formed as a multi-stack including the inorganic insulating layer and the organic insulating layer.

An OLED may be formed on the passivation layer 27.

According to one embodiment, the OLED includes a pixel electrode 31 disposed on the passivation layer 27, an opposite electrode 33 facing the pixel electrode 31, and an intermediate layer 32 interposed therebetween. The display device 200 may be classified as a bottom emission type display device, a top emission type display device, a dual emission type display device, or the like. A bottom emission type display device may include a light transmitting electrode as the pixel electrode 31 and a reflective electrode as the opposite electrode 33. A top emission type display may include a reflective electrode as the pixel electrode 31 and a semi-transmitting electrode as the opposite electrode 33. Although one embodiment is described with reference to the display device 200 as a bottom emission type display device, the present invention is not limited thereto.

The pixel electrode 31 may be formed as a transparent layer using ITO, IZO, ZnO, or $In_2O_3$ having a high work function. The pixel electrode 31 may be patterned to have an island form that corresponds to each pixel. Although not illustrated, the pixel electrode 31 may be connected to an external terminal (not shown) to serve as an anode.

A pixel-defining layer (PDL) 29 may be formed as an insulating layer on the pixel electrode 31 so as to cover the pixel electrode 31. After forming an opening (e.g., a predetermined opening) in the PDL 29, the intermediate layer 32 may be formed in a region defined by the opening, which will be describe below.

The opposite electrode 33 may be formed of, for example, Li, Ca, LiF/Ca, LiF/Al, Al, Mg, or Ag that have a low work function. The opposite electrode 33 may be formed over the entire emission region in which an image is realized. The opposite electrode 33 may be connected to an external terminal (not shown) to serve as a cathode.

Polarities of the pixel electrode 31 and the opposite electrode 33 may be switched.

In one embodiment the intermediate layer 32 includes an organic light-emitting layer, which may be formed of a low-molecular weight organic material or a polymer organic material. When the organic light-emitting layer is formed of a low-molecular weight organic material, a hole transport layer (HTL) and a hole injection layer (HIL) may be sequentially stacked below the organic light-emitting layer toward the pixel electrode 31, and an electron transport layer (ETL) and an electron injection layer (EIL) may be sequentially stacked on the organic light-emitting layer toward the opposite electrode 33. In addition to these layers, various layers may be stacked on or below the organic light-emitting layer if necessary.

When the organic light-emitting layer is a polymer organic layer formed of a large-molecular weight organic material, only a polymer HTL may be stacked on the organic light-emitting layer toward the pixel electrode 31. The polymer HTL may be formed on an upper surface of the pixel electrode 31 using, for example, poly(3,4-ethylenedioxythiophene) (PEDOT) or polyaniline (PANI) by inkjet printing, spin coating, or the like.

Figure 6:
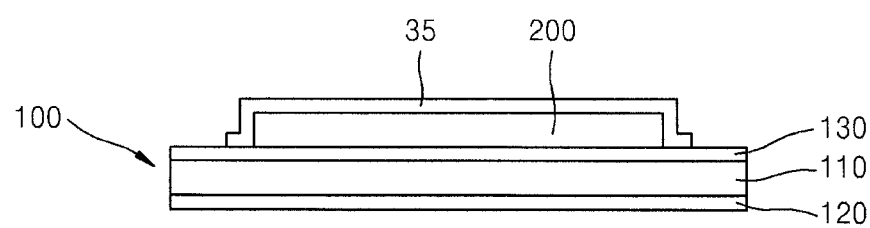

Next, referring to FIG. 6, in one embodiment the display unit 200 is encapsulated so as to be protected from external moisture or air (Operation S14). In particular, the display unit 200 may be sealed by forming a thin encapsulation film 35 on the display unit 200.

The encapsulation film 35 may have, but is not limited to, a structure in which an inorganic material layer including, for example, silicon oxide or silicon nitride, and an organic material layer including, for example, epoxy or polyimide, are alternately stacked. However, the present invention is not limited to this structure. In some embodiments, the display unit 200 may be encapsulated by using an encapsulation substrate. Examples of the encapsulation substrate are a glass substrate, a plastic substrate, or a stainless steel (SUS) substrate.

Figure 7:
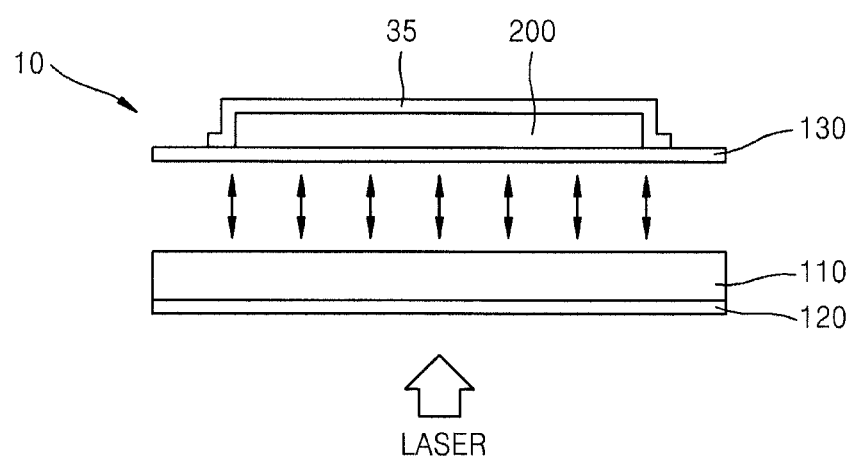

Next, referring to FIG. 7, in one embodiment a laser beam is irradiated to separate the second coating layer 130 from the base substrate 110 of the carrier substrate 100 (Operation S15). For example, when irradiated onto an interface between the second coating layer 130 formed of polyimide and the carrier substrate 100, a laser beam of a particular wavelength band and energy band may be absorbed by the polyimide polymer so that binding of polymer chains in the polyimide may be broken, and thus the second coating layer 130 may be delaminated from the carrier substrate 100.

The wavelength band of the irradiated laser beam may be from about 250 nm to 350 nm and the energy band may be from about 250 mJ/cm$^2$ to 350 mJ/cm$^2$. When the wavelength band is less than 250 nm or greater than 350 nm, bonds between polymer chains of the second coating layer 130 may not be debonded to delaminate the second coating layer 130. When the energy band is less than 250 mJ/cm$^2$, bonds between polymer chains of the second coating layer 130 may not be debonded to delaminate the second coating layer 130. When the energy band is greater than 350 mJ/cm$^2$, other members may be damaged.

The second coating layer 130 separated from the base substrate 110 may serve as a substrate of the flexible display device 10. The surface of the second coating layer 130 subjected to the laser irradiation may be processed by, for example, etching and washing, to remove the soot caused by the laser irradiation.

As described above, according to one or more embodiments of the preset invention, warpage of a carrier substrate during manufacture of a flat panel display device may be suppressed, and thus flexible display devices may be manufactured using the carrier substrate with a higher yield.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing a carrier substrate, the method comprising:
    forming a first coating layer on a first surface of a base substrate so as to cause a warpage of the base substrate; and
    forming a second coating layer on a second surface of the base substrate so as to compensate for the warpage of the base substrate,
    wherein the first coating layer and the second coating layer comprise polyimide, and a thickness of the first coating layer is different from a thickness of the second coating layer.

2. The method of claim 1, wherein the thickness of the second coating layer is greater than the thickness of the first coating layer.

3. The method of claim 2, wherein the thickness of the first coating layer is from about 6 μm to about 8 μm, and the thickness of the second coating layer is from about 8 μm to about 12 μm.

4. The method of claim 1, wherein the first coating layer and the second coating layer are formed using spin coating.

5. The method of claim 1, wherein the base substrate comprises glass.

* * * * *